(12) United States Patent
Hao

(10) Patent No.: US 10,778,147 B2
(45) Date of Patent: Sep. 15, 2020

(54) DRIVE LEVEL AUTO-TUNING SYSTEM, DRIVE LEVEL AUTO-TUNING METHOD AND NON-TRANSITORY COMPUTER READABLE MEDIUM

(71) Applicant: NANYA TECHNOLOGY CORPORATION, New Taipei (TW)

(72) Inventor: Chung-Peng Hao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/522,671

(22) Filed: Jul. 26, 2019

(65) Prior Publication Data

US 2020/0177127 A1    Jun. 4, 2020

Related U.S. Application Data

(60) Provisional application No. 62/774,870, filed on Dec. 4, 2018.

(51) Int. Cl.
*H03B 5/30* (2006.01)
*H03B 5/36* (2006.01)
*G06N 20/00* (2019.01)

(52) U.S. Cl.
CPC ............... *H03B 5/36* (2013.01); *G06N 20/00* (2019.01)

(58) Field of Classification Search
CPC .................................. H03B 5/36; G06N 20/00
USPC ...................... 331/116 R, 182, 183, 185, 186
See application file for complete search history.

(56) References Cited

U.S. PATENT DOCUMENTS

2012/0098609 A1\* 4/2012 Verma ...................... H03B 5/36
331/158

FOREIGN PATENT DOCUMENTS

TW            512585         12/2002

\* cited by examiner

*Primary Examiner* — Richard Tan
(74) *Attorney, Agent, or Firm* — CKC & Partners Co., LLC

(57) ABSTRACT

A drive level auto-tuning system includes a driver circuit, a resonant circuit, a driver controller and an automatic tuner. The resonant circuit is electrically connected to the driver circuit. The driver controller is electrically connected to the driver circuit. The automatic tuner is electrically connected to the driver controller, and the automatic tuner is configured to acquire a root-mean-square (RMS) current measured from the resonant circuit, so as to command the driver controller to automatically adjust a gain of driver circuit.

17 Claims, 5 Drawing Sheets

DRIVE LEVEL AUTO-TUNING SYSTEM, DRIVE LEVEL AUTO-TUNING METHOD AND NON-TRANSITORY COMPUTER READABLE MEDIUM

This application claims priority to U.S. Provisional Application Ser. No. 62/774,870, filed Dec. 4, 2018, which is herein incorporated by reference.

BACKGROUND

Field of Invention

The present invention relates to drive level auto-tuning systems and drive level auto-tuning methods.

Description of Related Art

A crystal oscillator is an electronic oscillator circuit that uses the mechanical resonance of a vibrating crystal of piezoelectric material to create an electrical signal with a precise frequency. For example, this frequency is often used to keep track of time, as in quartz wristwatches, to provide a stable clock signal for digital integrated circuits, and to stabilize frequencies for radio transmitters and receivers.

However, in conventional art, a drive level is manually adjusted by an engineer for a crystal oscillator driver. This manual adjustment is not a convenient manner.

SUMMARY

The following presents a simplified summary of the disclosure in order to provide a basic understanding to the reader. This summary is not an extensive overview of the disclosure and it does not identify key/critical components of the present invention or delineate the scope of the present invention. Its sole purpose is to present some concepts disclosed herein in a simplified form as a prelude to the more detailed description that is presented later.

According to embodiments of the present disclosure, the present disclosure provides a drive level auto-tuning system and a drive level auto-tuning method, to solve or circumvent aforesaid problems and disadvantages in the related art.

An embodiment of the present disclosure is related to a drive level auto-tuning system including a driver circuit, a resonant circuit, a driver controller and an automatic tuner. The resonant circuit is electrically connected to the driver circuit. The driver controller is electrically connected to the driver circuit. The automatic tuner is electrically connected to the driver controller, and the automatic tuner is configured to acquire a root-mean-square (RMS) current measured from the resonant circuit and compares the RMS current with at least one reference current to get a comparison result, so as to command the driver controller to automatically adjust a gain of driver circuit according to the comparison result, wherein the automatic tuner adjusts the at least one reference current through a learning rate current.

In one embodiment, the automatic tuner includes a first current comparator and a second current comparator. The first current comparator is configured to compares the RMS current with a first reference current, when the RMS current is less than the first reference current, the first current comparator configured to output a first logic low signal, and when the RMS current is greater than the first reference current, the first current comparator configured to output a first logic high signal. The second current comparator is configured to compares the RMS current with a second reference current, when the RMS current is less than the second reference current, the second current comparator configured to output a second logic low signal, and when the RMS current is greater than the second reference current, the second current comparator configured to output a second logic high signal, wherein the first reference current is greater than the second reference current.

In one embodiment, the driver controller decreases the gain of driver circuit when receiving the first logic high signal from the first current comparator and receiving the second logic high signal from the second current comparator, and the driver controller increases the gain of driver circuit when receiving the first logic low signal from the first current comparator and receiving the second logic low signal from the second current comparator.

In one embodiment, the automatic tuner stores training data and data input for machine learning, the training data includes at least one first training value, and the data input includes at least one first correct value, the automatic tuner increases a previous first reference current to be the first reference current when the first correct value is a logic low value and the first training value is a logic high value, and the automatic tuner decreases the previous first reference current to be the first reference current when the first correct value is the logic high value and the first training value is the logic low value.

In one embodiment, the automatic tuner further includes a current mirror circuit, a shunt circuit and a first transmission gate. The current mirror circuit is configured to mirror a reference current so as to output the previous first reference current. The shunt circuit is configured to provide a learning rate current divided from the reference current. The first transmission gate is configured to transmit the learning rate current to the previous first reference current when receiving the first correct value being the logic low value and receiving the first training value being the logic high value, so that the previous first reference current and the learning rate current are added to get the first reference current.

In one embodiment, the automatic tuner further includes a current subtractor and a second transmission gate. The current subtractor is configured to subtract the learning rate current from the previous first reference current to output the first reference current. The second transmission gate is configured to output the first reference current when receiving the first correct value being the logic high value and receiving the first training value being the logic low value.

In one embodiment, the automatic tuner stores training data and data input for machine learning, the training data includes at least one second training value, and the data input includes at least one second correct value, the automatic tuner increases a previous second reference current to be the second reference current when the second correct value is a logic low value and the second training value is a logic high value, and the automatic tuner decreases the previous second reference current to be the second reference current when the second correct value is the logic high value and the second training value is the logic low value.

In one embodiment, the automatic tuner further includes a current mirror circuit, a shunt circuit and a first transmission gate. The current mirror circuit is configured to mirror a reference current so as to output the previous second reference current. The shunt circuit is configured to provide a learning rate current divided from the reference current. The first transmission gate is configured to transmit the learning rate current to the previous second reference current when receiving the second correct value being the logic low value and receiving the second training value being the logic high value, so that the previous second reference current and the learning rate current are added to get the second reference current.

In one embodiment, the automatic tuner further includes a current subtractor and a second transmission gate. The current subtractor is configured to subtract the learning rate current from the previous second reference current to output the second reference current. The second transmission gate is configured to output the second reference current when receiving the second correct value being the logic high value and receiving the second training value being the logic low value.

Another embodiment of the present disclosure is related to a drive level auto-tuning method including steps of: acquiring a RMS current measured from a resonant circuit, and comparing the RMS current with at least one reference current to get a comparison result; and commanding a driver controller to automatically adjust a gain of a driver circuit according to the comparison result, where the driver circuit is electrically connected to the resonant circuit and the driver controller, where the at least one reference current is adjusted through a learning rate current.

In one embodiment, the drive level auto-tuning method further includes steps of: comparing the RMS current with a first reference current; outputting a first logic low signal when the RMS current is less than the first reference current; outputting a first logic high signal when the RMS current is greater than the first reference current; comparing the RMS current with a second reference current; outputting a second logic low signal when the RMS current is less than the second reference current; outputting a second logic high signal when the RMS current is greater than the second reference current, wherein the first reference current is greater than the second reference current.

In one embodiment, the drive level auto-tuning method further includes steps of: decreasing the gain of driver circuit when receiving the first logic high signal from the first current comparator and receiving the second logic high signal from the second current comparator; increasing the gain of driver circuit when receiving the first logic low signal from the first current comparator and receiving the second logic low signal from the second current comparator.

In one embodiment, the drive level auto-tuning method further includes steps of: storing training data and data input for machine learning, the training data includes at least one first training value, and the data input includes at least one first correct value; increasing a previous first reference current to be the first reference current when the first correct value is a logic low value and the first training value is a logic high value, decreasing the previous first reference current to be the first reference current when the first correct value is the logic high value and the first training value is the logic low value.

In one embodiment, the step of increasing the previous first reference current includes: mirroring a reference current so as to output the previous first reference current; providing a learning rate current divided from the reference current; transmitting the learning rate current to the previous first reference current when receiving the first correct value being the logic low value and receiving the first training value being the logic high value, so that the previous first reference current and the learning rate current are added to get the first reference current.

In one embodiment, the step of decreasing the previous first reference current includes: mirroring a reference current so as to output the previous first reference current; providing a learning rate current divided from the reference current; subtracting the learning rate current from the previous first reference current to output the first reference current; outputting the first reference current when receiving the first correct value being the logic high value and receiving the first training value being the logic low value.

In one embodiment, the drive level auto-tuning method further includes steps of: storing training data and data input for machine learning, the training data includes at least one second training value, and the data input includes at least one second correct value; increasing a previous second reference current to be the second reference current when the second correct value is a logic low value and the second training value is a logic high value; decreasing the previous second reference current to be the second reference current when the second correct value is the logic high value and the second training value is the logic low value.

In one embodiment, the step of increasing the previous second reference current includes: mirroring a reference current so as to output the previous second reference current; providing a learning rate current divided from the reference current; transmitting the learning rate current to the previous second reference current when receiving the second correct value being the logic low value and receiving the second training value being the logic high value, so that the previous second reference current and the learning rate current are added to get the second reference current.

In one embodiment, the step of decreasing the previous second reference current includes: mirroring a reference current so as to output the previous second reference current; providing a learning rate current divided from the reference current; subtracting the learning rate current from the previous second reference current to output the second reference current; outputting the second reference current when receiving the second correct value being the logic high value and receiving the second training value being the logic low value.

Yet another embodiment of the present disclosure is related to a non-transitory computer readable medium to store a plurality of instructions for commanding a computer to execute a drive level auto-tuning method, and the drive level auto-tuning method includes steps of: acquiring a RMS current measured from a resonant circuit, and comparing the RMS current with at least one reference current to get a comparison result; and commanding a driver controller to automatically adjust a gain of a driver circuit according to the comparison result, where the driver circuit is electrically connected to the resonant circuit and the driver controller, where the at least one reference current is adjusted through a learning rate current.

In one embodiment, the drive level auto-tuning method further includes steps of: comparing the RMS current with a reference current; commanding the driver controller to increase the gain of driver circuit when the RMS current is less than the reference current; commanding the driver controller to decrease the gain of driver circuit when the RMS current is greater than the reference current.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
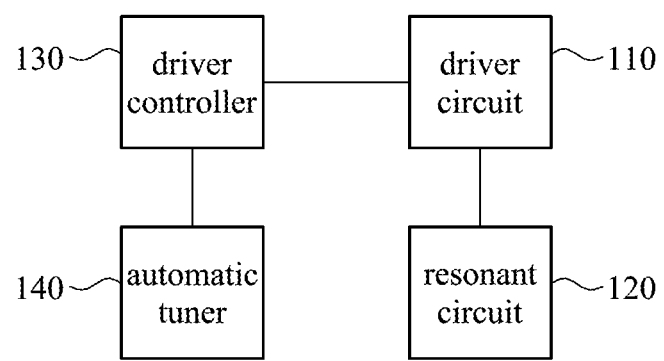
FIG. 1 is a schematic diagram illustrating a drive level auto-tuning system according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a drive level auto-tuning system according to some embodiments of the present disclosure. As shown in FIG. 1, the drive level auto-tuning system includes a driver circuit 110, a resonant circuit 120, a driver controller 130 and an automatic tuner 140. In structure, the resonant circuit 120 is electrically connected to the driver circuit 110, the driver controller 130 is electrically connected to the driver circuit 110, and the automatic tuner 140 is electrically connected to the driver controller 130.

In use, the resonant circuit 120 provides a source of an oscillating frequency, the driver circuit 110 provides a gain for maintaining the oscillation and outputs a clock frequency, the driver controller 130 adjusts the magnitude of the gain of the driver circuit 110 and adjusts a drive level of the resonant circuit 120.

The automatic tuner 140 acquires a root-mean-square (RMS) current measured from the resonant circuit 120 and compares the RMS current with one or more reference currents to get a comparison result, so as to command the driver controller 130 to automatically adjust the gain of driver circuit 110 according to the comparison result.

Moreover, the drive level auto-tuning system has a machine learning function. In practice, the automatic tuner 140 may has "comparison error" situation, and therefore the automatic tuner 140 adjusts the above one or more reference currents through a learning rate current, so that the automatic tuner 140 can correct the comparison error automatically. It should be noted that the choice of the magnitude of the learning rate current can affect the convergence time of aforesaid automatic correction.

Figure 2:
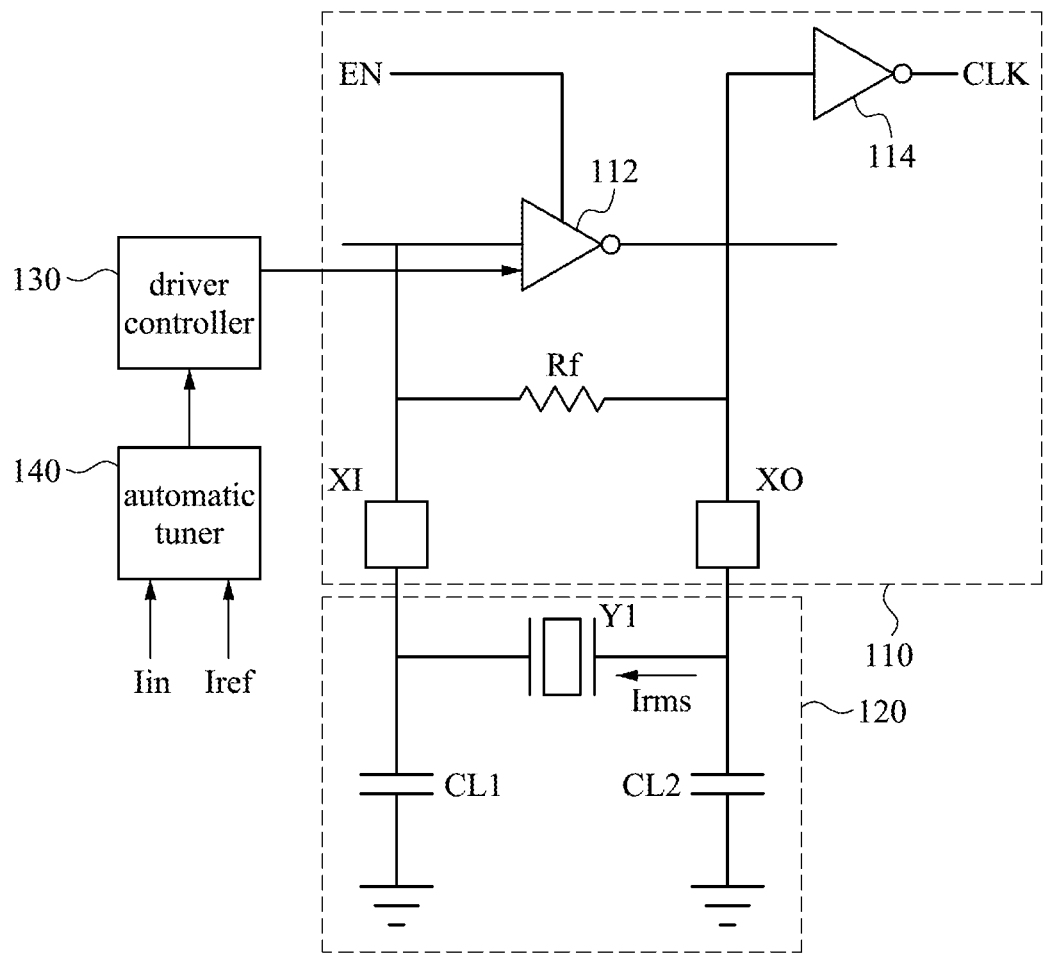
FIG. 2 is a schematic diagram illustrating a drive level auto-tuning system according to some embodiments of the present disclosure.

For more examples of the driver circuit 110 and the resonant circuit 120, referring FIG. 2, FIG. 2 is a schematic diagram illustrating a drive level auto-tuning system according to some embodiments of the present disclosure.

In FIG. 2, the resonant circuit 120 can be a crystal oscillator for example, and the crystal oscillator includes a crystal Y1 and capacitors CL1 and CL2. In structure, one end of the crystal Y1 is electrically connected to the capacitor CL1, and the other end of the crystal Y1 is electrically connected to the capacitor CL2.

In FIG. 2, the driver circuit 110 can be a crystal oscillator driver for example, and the crystal oscillator driver includes inverting amplifiers 112 and 114, a resistor Rf and pads XI and XO. In structure, an input terminal of the inverting amplifier 112 is electrically connected to one end of the resistor Rf and the pad XI, and an output terminal of the inverting amplifier 112 is electrically connected to the other end of the resistor Rf, the pad XO and an input terminal of the inverting amplifier 114. In use, the inverting amplifier 112 is enabled by an enabling signal EN, and the driver circuit 110 and the resonant circuit 120 operates on the basis of-Barkhausen's stability criterion, so that the inverting amplifier 114 can output clock (square wave) signals CLK.

Each individual crystal Y1 has an individual specification of drive level. The drive level is: $Irms^2 *R$, where Irms is a root-mean-square (RMS) current through the crystal Y1, and R is a resistance value of the crystal Y1.

For adjusting the drive level of the resonant circuit 120, the automatic tuner 140 is configured to acquire the RMS current Irms measured from the resonant circuit 120, so as to command the driver controller 130 to automatically adjust a gain of driver circuit 110. For example, the RMS current Irms can be measured by an oscilloscope with current probe or current detector, and the current detector can be embedded in the automatic tuner 140 or an external current detector.

For example, the driver controller 130 automatically adjusts a gain of the inverting amplifier 112. When the gain of driver circuit 110 is adjusted; when the gain of the inverting amplifier 112 is changed, the RMS current Irms is changed, thereby adjusting the drive level.

In one embodiment, the automatic tuner 140 is configured to compare the RMS current Iin (e.g., Irms) with a reference current Iref. When the RMS current Iin is less than the reference current Iref, the automatic tuner 140 commands the driver controller 130 to increase the gain of driver circuit 110. When the RMS current Iin is greater than the reference current Iref, the automatic tuner 140 commands the driver controller 130 to decrease the gain of driver circuit 110.

Figure 3:
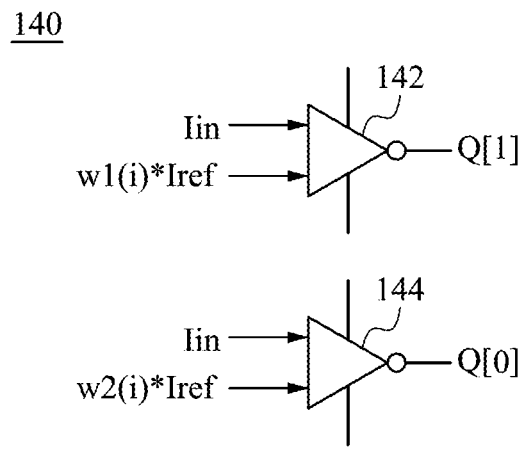
FIG. 3 is a circuit diagram illustrating current comparators according to some embodiments of the present disclosure.

For a more complete understanding of the automatic tuner 140, referring FIGS. 2 and 3, FIG. 3 is a circuit diagram illustrating current comparators 142 and 144 according to some embodiments of the present disclosure. The automatic tuner 140 includes the first current comparator 142 and the second current comparator 144. The first current comparator 142 is configured to compares the RMS current Iin with a first reference current w1(i)*Iref. When the RMS current Iin is less than the first reference current w1(i)*Iref, the first current comparator is configured to output a first logic signal Q[1] being a first logic low signal (e.g., a logic 0 signal). When the RMS current Iin is greater than the first reference current w1(i)*Iref, the first current comparator 142 is configured to output the first logic signal Q[1] being a first logic high signal (e.g., a logic 1 signal). The second current comparator 144 is configured to compares the RMS current Iin with a second reference current. When the RMS current Iin is less than the second reference current w2(i)*Iref, the second current comparator is configured to output a second logic signal Q[0] being a second logic low signal (e.g., a logic 0 signal). When the RMS current Iin is greater than the second reference current w2(i)*Iref, the second current 144 is comparator configured to output a second logic signal Q[0] being a second logic high signal (e.g., a logic 1 signal), where the first reference current w1(i)*Iref is greater than the second reference current w2(i)*Iref. For example, the first reference current w1(i)*Iref is: a first weighting number w1(i)×the reference current Iref; the second reference current w2(i)*Iref is: a second weighting number w2(i)×the reference current Iref, where the first weighting number w1(i) is greater than the second weighting number w2(i).

When the first and second logic signals Q[1] and Q[0] both are logic high signals, it means that the RMS current Iin is high. When the first logic signal Q[1] is the logic low signal, and when the second logic signal Q[0] is a second logic high signal, it means that the RMS current Iin is middle. When the first and second logic signals Q[1] and Q[0] both are logic low signals, it means that the RMS current Iin is low.

The driver controller 130 decreases the gain of driver circuit 110 when receiving the first logic high signal from the first current comparator 142 and receiving the second logic high signal from the second current comparator 144. The driver controller 130 increases the gain of driver circuit 110 when receiving the first logic low signal from the first current comparator 142 and receiving the second logic low signal from the second current comparator 144.

The automatic tuner 140 supports machine learning functions. The function is: $w(i)=w(i-1)+\Delta w$, where $w(i)$ is a weighting number, $w(i-1)$ is a previous weighting number, $i=1, 2, 3, \ldots N$, and $\Delta w=\eta*[Q'-Q]$, in which $\eta$ is a learning rate (e.g., $0<\eta<1$), Q is the correct value, and Q' is the training value. When $i=1$, $w(0)$ means an initial weighting number that can be 1. In some embodiment, $w(i)$ can be the first weighting number w1(i) is greater than the second weighting number w2(i). Similarly, $w1(i)=w1(i-1)+\Delta w1$, and $w2(i)=w2(i-1)+\Delta w2$.

Various RMS currents measured from the resonant circuit 120, and the various data outputted from the first current comparator 142 can divided into training data and data input. The automatic tuner 140 stores the training data and the data input for machine learning. The training data includes at least one first training value, and the data input includes at least one first correct value, where the first correct value can be verified through conventional or future check technology. The automatic tuner 140 increases a previous first reference current w1(i-1)*Iref to be the first reference current w1(i)*Iref when the first correct value is a logic low value and the first training value is a logic high value. The automatic tuner 140 decreases the previous first reference current w1(i-1)*Iref to be the first reference current w1(i)*Iref when the first correct value is the logic high value and the first training value is the logic low value.

Similarly, various RMS currents measured from the resonant circuit 120, and the various data outputted from the second current comparator 142 can divided into training data and data input. The training data includes at least one second training value, and the data input includes at least one second correct value, where the second correct value can be verified through conventional or future check technology. The automatic tuner 140 increases a previous second reference current w2(i-1)*Iref to be the second reference current w2(i)*Iref when the second correct value is a logic low value and the second training value is a logic high value. The automatic tuner 140 decreases the previous second reference current w2(i-1)*Iref to be the second reference current w2(i)*Iref when the second correct value is the logic high value and the second training value is the logic low value.

Figure 4:
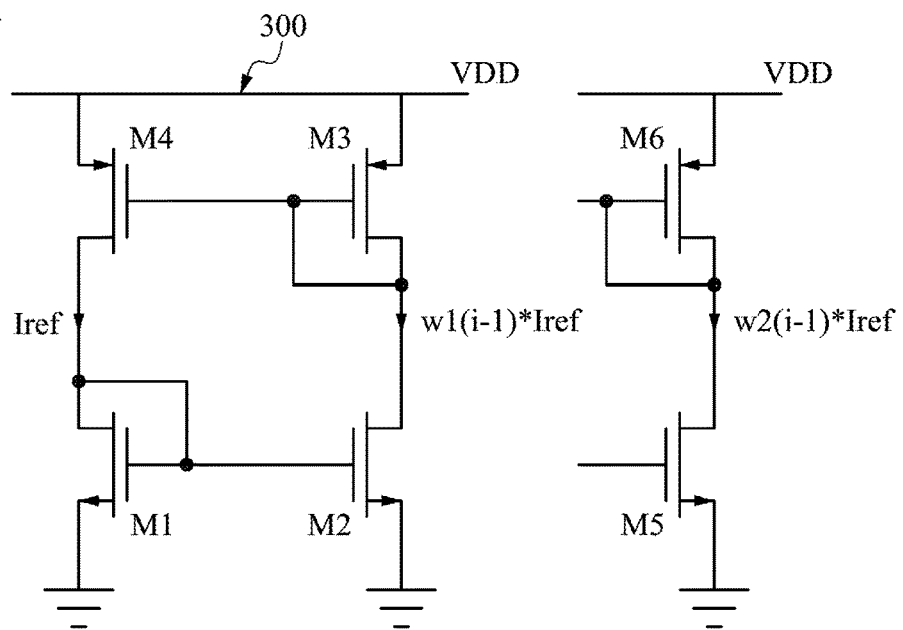
FIG. 4 is a circuit diagram illustrating a current mirror circuit according to some embodiments of the present disclosure.
Figure 5:
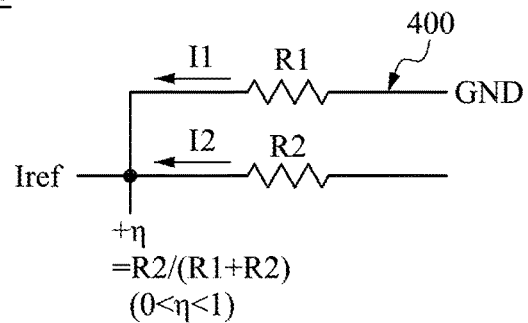
FIG. 5 is a circuit diagram illustrating a shunt circuit according to some embodiments of the present disclosure.
Figure 6:
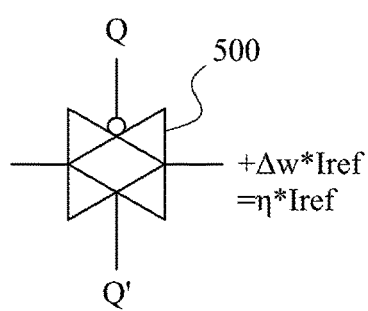
FIG. 6 is a circuit diagram illustrating a first transmission gate according to some embodiments of the present disclosure.

In some embodiments, the automatic tuner 140 further includes a current mirror circuit 300, a shunt circuit 400 and a first transmission gate 500. FIG. 4 is a circuit diagram illustrating the current mirror circuit 300 according to some embodiments of the present disclosure. FIG. 5 is a circuit diagram illustrating a shunt circuit 400 according to some embodiments of the present disclosure. FIG. 6 is a circuit diagram illustrating a first transmission gate 500 according to some embodiments of the present disclosure.

In FIG. 4, the current mirror circuit 300 includes p-type metal-oxide-semiconductors (PMOSs) M3, M4 and M6, and n-type metal-oxide-semiconductors (NMOSs) M1, M2 and M5. In use, the current mirror circuit 300 is configured to mirror the reference current Iref so as to output the previous first reference current w1(i-1)*Iref and the previous second reference current w2(i-1)*Iref.

In FIG. 5, the shunt circuit 400 includes resistors R1 and R2 connected in parallel. A learning rate $\eta$ is $R2/(R1+R2)$, and thus $0<\eta<1$. In this way, the shunt circuit is configured to provide a learning rate current I1 divided from the reference current Iref, where the learning rate current I1 (i.e., $\eta*Iref$) is: the learning rate $\eta$×the reference current Iref.

In FIG. 6, the first transmission gate 500 is configured to transmit the learning rate current $\eta*Iref$ to the previous first reference current w1(i-1)*Iref when receiving the first correct value Q being the logic low value and receiving the first training value Q' being the logic high value, so that the previous first reference current w1(i-1)*Iref and the learning rate current $\eta*Iref$ are added to get the first reference current w1(i)*Iref.

In another embodiment, the first transmission gate 500 is configured to transmit the learning rate current η*Iref to the previous second reference current w2(i−1)*Iref when receiving the second correct value Q being the logic low value and receiving the second training value Q' being the logic high value, so that the previous second reference current w2(i−1)*Iref and the learning rate current η*Iref are added to get the second reference current w2(i)*Iref.

Figure 7:
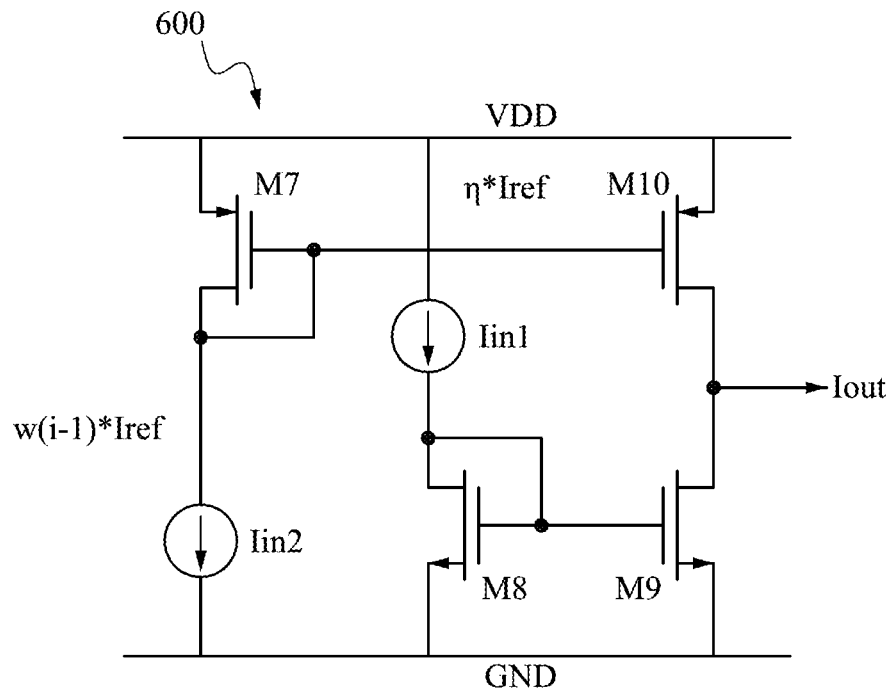
FIG. 7 is a circuit diagram illustrating a current subtractor according to some embodiments of the present disclosure.
Figure 8:
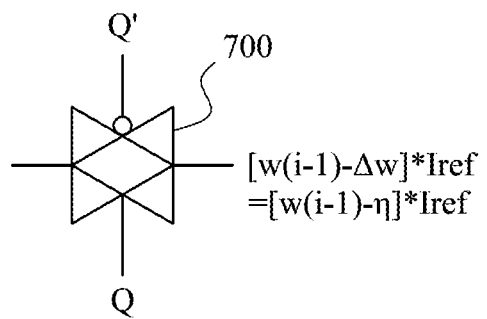
FIG. 8 is a circuit diagram illustrating a second transmission gate according to some embodiments of the present disclosure.

In one embodiment, the automatic tuner 140 includes a current subtractor 600 and a second transmission gate 700. FIG. 7 is a circuit diagram illustrating the current subtractor 600 according to some embodiments of the present disclosure. FIG. 8 is a circuit diagram illustrating the second transmission gate 700 according to some embodiments of the present disclosure.

In FIG. 7, the current subtractor 600 includes PMOSs M7 and M10, NMOSs M8 and M9, and current sources Iin1 and Iin2. In use, the current sources Iin2 provides a previous reference current w(i−1)*Iref that may be the previous first reference current w1(i−1)*Iref or the previous second reference current w2(i−1)*Iref, and the current sources Iin1 provides the learning rate current η*Iref. The current subtractor is configured to subtract the learning rate current η*Iref from the previous reference current w(i−1)*Iref to output the reference current [w(i−1)−η]*Iref. The second transmission gate 700 is configured to output the reference current [w(i−1)−η]*Iref when receiving the first correct value Q being the logic high value and receiving the first training value Q' being the logic low value. In FIG. 7 and FIG. 8, when the previous reference current w(i−1)*Iref is the previous first reference current w1(i−1)*Iref, the reference current [w(i−1)−η]*Iref is the first reference current w1(i)*Iref; when the previous reference current w(i−1)*Iref is the previous second reference current w2(i−1)*Iref, the reference current [w(i−1)−η]*Iref is the second reference current w2(i)*Iref.

In some embodiments, the automatic tuner 140 includes two substantially the same current subtractors 600, except that a current sources Iin2 of one current subtractor 600 provides the previous first reference current w1(i−1)*Iref, and a current sources Iin2 of the other current subtractor 600 provides the previous second reference current w2(i−1)*Iref; the present disclosure is not limited thereto.

In view of the above, when the first and second correct values are the logic high values (e.g., logic 1), when the first training value is the logic low value (e.g., logic 0), and when the second training value is the logic high value (e.g., logic 1), Δw1=−η, and Δw2=0.

When the first correct value is the logic low value (e.g., logic 0), when the second correct value is the logic high value (e.g., logic 1), and when the first and second training values are the logic high values (e.g., logic 1), Δw1=+η, and Δw2=0.

When the first and second correct values are the logic low values (e.g., logic 0), when the first training value is the logic low value (e.g., logic 0), and when the second training value is the logic high value (e.g., logic 1), Δw1=0, and Δw2=+η.

When the first correct value is the logic low value (e.g., logic 0), when the second correct value is the logic high value (e.g., logic 1), and when the first and second training values are the logic low values (e.g., logic 0), Δw1=0, and Δw2=−η.

For a more complete understanding of a drive level auto-tuning method performed by above drive level auto-tuning system 100, referring FIGS. 1 to 9, FIG. 9 is a flow chart illustrating a drive level auto-tuning method 800 according to some embodiments of the present disclosure.

Figure 9:
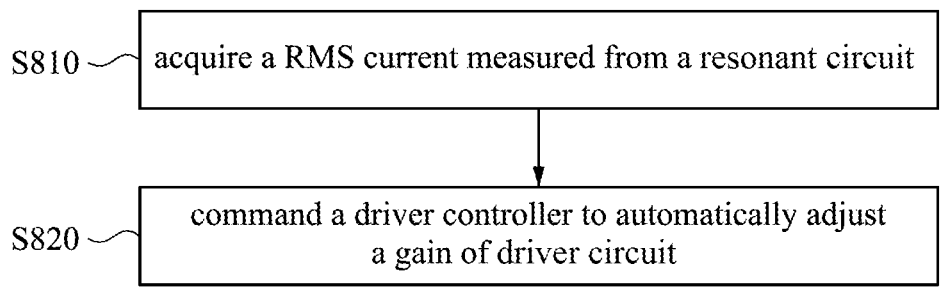
FIG. 9 is a flow chart illustrating a drive level auto-tuning method according to some embodiments of the present disclosure.

As shown in FIG. 9, the drive level auto-tuning method 800 includes operations S810 and S820. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The drive level auto-tuning method 800 may take the form of a computer program product on a computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives.

In operation S810, a RMS current Iin is acquired from the resonant circuit 120, so as to command the driver controller 130 to automatically adjust a gain of driver circuit 110 in operation S820.

Specifically, in operation S810, a RMS current Iin is acquired from the resonant circuit 120 and the RMS current is compared with one or more reference currents to get a comparison result. In operation S820, the driver controller 130 is commanded to automatically adjust a gain of driver circuit 110 according to the comparison result in operation S820. In practice, the "comparison error" situation may occurs, and therefore the above one or more reference currents can be adjusted through a learning rate current, so that the comparison error can be corrected automatically.

In one embodiment, the drive level auto-tuning method 800 further includes steps of: comparing the RMS current Iin with a reference current Iref; commanding the driver controller to increase the gain of driver circuit 110 when the RMS current Iin is less than the reference current Iref; commanding the driver controller 130 to decrease the gain of driver circuit 110 when the RMS current Iin is greater than the reference current Iref.

In one embodiment, the drive level auto-tuning method 800 further includes steps of: comparing the RMS current Iin with a first reference current w1(i)*Iref; outputting a first logic low signal when the RMS current Iin is less than the first reference current w1(i)*Iref; outputting a first logic high signal when the RMS current Iin is greater than the first reference current w1(i)*Iref; comparing the RMS current Iin with a second reference current w2(i)*Iref; outputting a second logic low signal when the RMS current Iin is less than the second reference current w2(i)*Iref; outputting a second logic high signal when the RMS current Iin is greater than the second reference current w2(i)*Iref, where the first reference current w1(i)*Iref is greater than the second reference current w2(i)*Iref.

In one embodiment, the drive level auto-tuning method 800 further includes steps of: decreasing the gain of driver circuit 110 when receiving the first logic high signal from the first current comparator 142 and receiving the second logic high signal from the second current comparator 144; increasing the gain of driver circuit 110 when receiving the first logic low signal from the first current comparator 142 and receiving the second logic low signal from the second current comparator 144.

In one embodiment, the drive level auto-tuning method 800 further includes steps of: storing training data and data input for machine learning, the training data includes at least one first training value, and the data input includes at least one first correct value; increasing a previous first reference current $w1(i-1)*Iref$ to be the first reference current $w1(i)*Iref$ when the first correct value is a logic low value and the first training value is a logic high value, decreasing the previous first reference current $w1(i-1)*Iref$ to be the first reference current $w1(i)*Iref$ when the first correct value is the logic high value and the first training value is the logic low value.

In one embodiment, the step of increasing the previous first reference current $w1(i-1)*Iref$ includes: mirroring a reference current Iref so as to output the previous first reference current $w1(i-1)*Iref$; providing a learning rate current $\eta*Iref$ divided from the reference current Iref; transmitting the learning rate current to the previous first reference current $w1(i-1)*Iref$ when receiving the first correct value Q being the logic low value and receiving the first training value Q' being the logic high value, so that the first previous reference current $w1(i-1)*Iref$ and the learning rate current $\eta*Iref$ are added to get the first reference current $w1(i)*Iref$.

In one embodiment, the step of decreasing the previous first reference current $w1(i-1)*Iref$ includes: mirroring a reference current Iref so as to output the previous first reference current $w1(i-1)*Iref$; providing a learning rate current $\eta*Iref$ divided from the reference current; subtracting the learning rate current from the previous first reference current $w1(i-1)*Iref$ to output the first reference current $w1(i)*Iref$; outputting the first reference current $w1(i)*Iref$ when receiving the first correct value Q being the logic high value and receiving the first training value Q' being the logic low value.

In one embodiment, the drive level auto-tuning method 800 further includes steps of: storing training data and data input for machine learning, the training data includes at least one second training value, and the data input includes at least one second correct value; increasing a previous second reference current $w2(i-1)*Iref$ to be the second reference current $w2(i)*Iref$ when the second correct value is a logic low value and the second training value is a logic high value; decreasing the previous second reference current $w2(i-1)*Iref$ to be the second reference current $w2(i)*Iref$ when the second correct value is the logic high value and the second training value is the logic low value.

In one embodiment, the step of increasing the previous second reference current $w2(i-1)*Iref$ includes: mirroring a reference current Iref so as to output the previous second reference current $w2(i-1)*Iref$; providing a learning rate current $\eta*Iref$ divided from the reference current; transmitting the learning rate current $\eta*Iref$ to the previous second reference current $w2(i-1)*Iref$ when receiving the second correct value Q being the logic low value and receiving the second training value Q' being the logic high value, so that the previous second reference current $w2(i-1)*Iref$ and the learning rate current $\eta*Iref$ are added to get the second reference current $w2(i)*Iref$.

In one embodiment, the step of decreasing the previous second reference current $w2(i-1)*Iref$ includes: mirroring a reference current Iref so as to output the previous second reference current $w2(i-1)*Iref$; providing a learning rate current $\eta*Iref$ divided from the reference current Iref; subtracting the learning rate current $\eta*Iref$ from the previous second reference current $w2(i-1)*Iref$ to output the second reference current $w2(i)*Iref$; outputting the second reference current $w2(i)*Iref$ when receiving the second correct value Q being the logic high value and receiving the second training value Q' being the logic low value.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A drive level auto-tuning system, comprising:
a driver circuit;
a resonant circuit electrically connected to the driver circuit;
a driver controller electrically connected to the driver circuit; and
an automatic tuner electrically connected to the driver controller, and the automatic tuner configured to acquire a root-mean-square (RMS) current measured from the resonant circuit and compares the RMS current with at least one reference current to get a comparison result, so as to command the driver controller to automatically adjust a gain of the driver circuit according to the comparison result, wherein the automatic tuner adjusts the at least one reference current through a learning rate current, wherein the automatic tuner comprises:
a first current comparator configured to compares the RMS current with a first reference current, when the RMS current is less than the first reference current, the first current comparator configured to output a first logic low signal, and when the RMS current is greater than the first reference current, the first current comparator configured to output a first logic high signal; and
a second current comparator configured to compares the RMS current with a second reference current, when the RMS current is less than the second reference current, the second current comparator configured to output a second logic low signal, and when the RMS current is greater than the second reference current, the second current comparator configured to output a second logic high signal, wherein the first reference current is greater than the second reference current.

2. The drive level auto-tuning system of claim 1, wherein the driver controller decreases the gain of driver circuit when receiving the first logic high signal from the first current comparator and receiving the second logic high signal from the second current comparator, and the driver controller increases the gain of driver circuit when receiving the first logic low signal from the first current comparator and receiving the second logic low signal from the second current comparator.

3. The drive level auto-tuning system of claim 1, wherein the automatic tuner stores training data and data input for machine learning, the training data comprises at least one first training value, and the data input comprises at least one first correct value, the automatic tuner increases a previous first reference current to be the first reference current when the first correct value is a logic low value and the first training value is a logic high value, and the automatic tuner decreases the previous first reference current to be the first reference current when the first correct value is the logic high value and the first training value is the logic low value.

4. The drive level auto-tuning system of claim 3, wherein the automatic tuner further comprises:
- a current mirror circuit configured to mirror a reference current so as to output the previous first reference current;
- a shunt circuit configured to provide the learning rate current divided from the reference current; and
- a first transmission gate configured to transmit the learning rate current to the previous first reference current when receiving the first correct value being the logic low value and receiving the first training value being the logic high value, so that the previous first reference current and the learning rate current are added to get the first reference current.

5. The drive level auto-tuning system of claim 4, wherein the automatic tuner further comprises:
- a current subtractor configured to subtract the learning rate current from the previous first reference current to output the first reference current; and
- a second transmission gate configured to output the first reference current when receiving the first correct value being the logic high value and receiving the first training value being the logic low value.

6. The drive level auto-tuning system of claim 1, wherein the automatic tuner stores training data and data input for machine learning, the training data comprises at least one second training value, and the data input comprises at least one second correct value, the automatic tuner increases a previous second reference current to be the second reference current when the second correct value is a logic low value and the second training value is a logic high value, and the automatic tuner decreases the previous second reference current to be the second reference current when the second correct value is the logic high value and the second training value is the logic low value.

7. The drive level auto-tuning system of claim 6, wherein the automatic tuner further comprises:
- a current mirror circuit configured to mirror a reference current so as to output the previous second reference current;
- a shunt circuit configured to provide the learning rate current divided from the reference current; and
- a first transmission gate configured to transmit the learning rate current to the second previous reference current when receiving the second correct value being the logic low value and receiving the second training value being the logic high value, so that the previous second reference current and the learning rate current are added to get the second reference current.

8. The drive level auto-tuning system of claim 7, wherein the automatic tuner further comprises:
- a current subtractor configured to subtract the learning rate current from the previous second reference current to output the second reference current; and
- a second transmission gate configured to output the second reference current when receiving the second correct value being the logic high value and receiving the second training value being the logic low value.

9. A drive level auto-tuning method, comprising:
- acquiring a root-mean-square (RMS) current measured from a resonant circuit;
- comparing the RMS current with a first reference current;
- outputting a first logic low signal when the RMS current is less than the first reference current;
- outputting a first logic high signal when the RMS current is greater than the first reference current;
- comparing the RMS current with a second reference current;
- outputting a second logic low signal when the RMS current is less than the second reference current; and
- outputting a second logic high signal when the RMS current is greater than the second reference current, wherein the first reference current is greater than the second reference current;
- acquiring a comparison result according to a outputting result; and
- commanding a driver controller to automatically adjust a gain of a driver circuit according to the comparison result, wherein the driver circuit electrically connected to the resonant circuit and the driver controller, wherein the first reference current and the second reference current are adjusted through a learning rate current.

10. The drive level auto-tuning method of claim 9, further comprising:
- decreasing the gain of driver circuit when receiving the first logic high signal from the first current comparator and receiving the second logic high signal from the second current comparator; and
- increasing the gain of driver circuit when receiving the first logic low signal from the first current comparator and receiving the second logic low signal from the second current comparator.

11. The drive level auto-tuning method of claim 9, further comprising:
- storing training data and data input for machine learning, the training data comprises at least one first training value, and the data input comprises at least one first correct value;
- increasing a previous first reference current to be the first reference current when the first correct value is a logic low value and the first training value is a logic high value, and
- decreasing the previous first reference current to be the first reference current when the first correct value is the logic high value and the first training value is the logic low value.

12. The drive level auto-tuning method of claim 11, wherein the step of increasing the previous first reference current comprises:
- mirroring a reference current so as to output the previous first reference current;
- providing the learning rate current divided from the reference current; and
- transmitting the learning rate current to the previous first reference current when receiving the first correct value being the logic low value and receiving the first training value being the logic high value, so that the previous first reference current and the learning rate current are added to get the first reference current.

13. The drive level auto-tuning method of claim 11, wherein the step of decreasing the previous first reference current comprises:
- mirroring a reference current so as to output the previous first reference current;
- providing the learning rate current divided from the reference current;
- subtracting the learning rate current from the previous first reference current to output the first reference current; and
- outputting the first reference current when receiving the first correct value being the logic high value and receiving the first training value being the logic low value.

14. The drive level auto-tuning method of claim 9, further comprising:
   storing training data and data input for machine learning, the training data comprises at least one second training value, and the data input comprises at least one second correct value,
   increasing a previous second reference current to be the second reference current when the second correct value is a logic low value and the second training value is a logic high value, and
   decreasing the previous second reference current to be the second reference current when the second correct value is the logic high value and the second training value is the logic low value.

15. The drive level auto-tuning method of claim 14, wherein the step of increasing the second reference current comprises:
   mirroring a reference current so as to output the previous second reference current;
   providing the learning rate current divided from the reference current; and
   transmitting the learning rate current to the previous second reference current when receiving the second correct value being the logic low value and receiving the second training value being the logic high value, so that the previous second reference current and the learning rate current are added to get the second reference current.

16. The drive level auto-tuning method of claim 14, wherein the step of decreasing the previous second reference current comprises:
   mirroring a reference current so as to output the previous second reference current;
   providing the learning rate current divided from the reference current;
   subtracting the learning rate current from the previous second reference current to output the second reference current; and
   outputting the second reference current when receiving the second correct value being the logic high value and receiving the second training value being the logic low value.

17. A non-transitory computer readable medium to store a plurality of instructions for commanding a computer to execute a drive level auto-tuning method, and the drive level auto-tuning method comprising:
   acquiring a root-mean-square (RMS) current measured from a resonant circuit;
   comparing the RMS current with a first reference current;
   outputting a first logic low signal when the RMS current is less than the first reference current;
   outputting a first logic high signal when the RMS current is greater than the first reference current;
   comparing the RMS current with a second reference current;
   outputting a second logic low signal when the RMS current is less than the second reference current; and
   outputting a second logic high signal when the RMS current is greater than the second reference current, wherein the first reference current is greater than the second reference current;
   acquiring a comparison result according to a outputting result; and
   commanding a driver controller to automatically adjust a gain of a driver circuit according to the comparison result, wherein the driver circuit electrically connected to the resonant circuit and the driver controller, wherein the first reference current and the second reference current are adjusted through a learning rate current.

* * * * *